(12) United States Patent
Mantese et al.

(10) Patent No.: US 10,599,886 B2
(45) Date of Patent: Mar. 24, 2020

(54) MAGNETIC IDENTIFICATION ASSEMBLY AND METHOD OF IDENTIFYING A COMPONENT

(71) Applicant: SIKORSKY AIRCRAFT CORPORATION, Stratford, CT (US)

(72) Inventors: Joseph V. Mantese, Ellington, CT (US); Nicholas Charles Soldner, Southbury, CT (US); Michael A. Klecka, Vernon, CT (US)

(73) Assignee: SIKORSKY AIRCRAFT CORPORATION, Stratford, CT (US)

(\*) Notice: Subject to any disclaimer, the term of this patent is extended or adjusted under 35 U.S.C. 154(b) by 54 days.

(21) Appl. No.: 15/517,100

(22) PCT Filed: Oct. 16, 2015

(86) PCT No.: PCT/US2015/055974
§ 371 (c)(1),
(2) Date: Apr. 5, 2017

(87) PCT Pub. No.: WO2016/061478
PCT Pub. Date: Apr. 21, 2016

(65) Prior Publication Data
US 2017/0308726 A1  Oct. 26, 2017

Related U.S. Application Data

(60) Provisional application No. 62/064,745, filed on Oct. 16, 2014.

(51) Int. Cl.
*G06K 7/08* (2006.01)
*G01R 33/12* (2006.01)
(Continued)

(52) U.S. Cl.
CPC .......... *G06K 7/08* (2013.01); *G01R 33/0094* (2013.01); *G01R 33/02* (2013.01); *G01R 33/10* (2013.01);
(Continued)

(58) Field of Classification Search
CPC .............. G06K 7/08; G06K 19/06187; G01R 33/1276; G01R 33/10; G01R 33/12; G01R 33/02; G01R 33/0094
See application file for complete search history.

(56) References Cited

U.S. PATENT DOCUMENTS 2,914,746 A   11/1959   James
5,965,214 A   10/1999   Crossfield et al.
(Continued)

FOREIGN PATENT DOCUMENTS

JP   H0934975 A   2/1997

OTHER PUBLICATIONS

Notification of Transmittal of the International Search Report for International Application No. PCT/US2015/055974 dated Dec. 14, 2015; dated Jan. 6, 2016; 10 pages.
(Continued)

*Primary Examiner* — Huy Q Phan
*Assistant Examiner* — Zannatul Ferdous
(74) *Attorney, Agent, or Firm* — Cantor Colburn LLP

(57) ABSTRACT

An embedded magnetic identification assembly includes a base component formed of a material. Also included is a plurality of elements formed in an array at a surface of the base component, wherein the plurality of elements is formed of a magnetic material.

14 Claims, 2 Drawing Sheets

(51) Int. Cl.
  *G01R 33/10* (2006.01)
  *G01R 33/02* (2006.01)
  *G01R 33/00* (2006.01)
  *G06K 19/06* (2006.01)

(52) U.S. Cl.
  CPC ......... *G01R 33/12* (2013.01); *G01R 33/1276* (2013.01); *G06K 19/06187* (2013.01)

(56) References Cited

U.S. PATENT DOCUMENTS

| | | | |
|---|---|---|---|
| 6,395,151 B1 | 5/2002 | Schramm et al. | |
| 6,440,520 B1 | 8/2002 | Baglin et al. | |
| 6,847,299 B2 | 1/2005 | Franks | |
| 8,270,603 B1* | 9/2012 | Durst | G06K 19/086 380/54 |
| 9,030,366 B2* | 5/2015 | Ito | H01Q 1/52 343/787 |
| 2003/0123930 A1* | 7/2003 | Jacobs | E01F 9/512 404/12 |
| 2004/0137203 A1 | 7/2004 | Adams et al. | |
| 2005/0017082 A1 | 1/2005 | Moran et al. | |
| 2005/0218223 A1 | 10/2005 | Pasulka et al. | |
| 2009/0218401 A1 | 9/2009 | Moran et al. | |
| 2010/0045285 A1* | 2/2010 | Ohmori | B82Y 25/00 324/260 |
| 2010/0219156 A1* | 9/2010 | Hipwell, Jr. | B81C 1/00031 216/22 |
| 2012/0104097 A1 | 5/2012 | Moran et al. | |
| 2012/0183701 A1 | 7/2012 | Pilz et al. | |
| 2015/0004438 A1* | 1/2015 | Takizawa | G11B 5/855 428/832 |
| 2016/0041005 A1* | 2/2016 | Shimizu | G01D 5/145 324/207.2 |

OTHER PUBLICATIONS

Written Opinion of the International Searching Authority for International Application No. PCT/US2015/055974 dated Dec. 14, 2015; dated Jan. 6, 2016; 5 pages.
Extended European Search Report for Application No./Patent No. 15850717.8-1022/3207391 PCT/US2015055974, dated Jun. 5, 2018 (14 pp.)

* cited by examiner

MAGNETIC IDENTIFICATION ASSEMBLY AND METHOD OF IDENTIFYING A COMPONENT

CROSS REFERENCE TO RELATED APPLICATIONS

This application is a National Stage application of PCT/US2015/055974, filed Oct. 16, 2015, which claims the benefit of U.S. Provisional Application No. 62/064,745, filed Oct. 16, 2014, both of which are incorporated by reference in their entirety herein.

BACKGROUND OF THE INVENTION

The embodiments described herein generally relate to identification systems for components and, more particularly, to an embedded magnetic identification assembly, as well as a method of identifying components.

Numerous industries use identification markings to identify parts and components. Various marking systems and methods have been employed to provide a human or machine readable marking that enables positive identification of a particular component. The markings are typically made in some manner on an outer surface of a component to be identified or physically attached thereto. Examples of known markings include alphanumeric characters, bar codes, RFID tags, etc. Such markings have many uses, such as service history tracking and anti-counterfeiting, for example. Unfortunately, some marked components are subjected to harsh environments during manufacturing and/or operation that damage or render useless the original markings. Additionally, as noted above, these markings are typically present on an outer surface of the component (i.e., external location) which allows the markings to be easily seen, removed or damaged. Therefore, certain disadvantages are present with common markings, particularly those made on external portions of a component to be identified.

BRIEF DESCRIPTION OF THE INVENTION

According to one embodiment, a magnetic identification assembly includes a base component formed of a material. Also included is a plurality of elements formed in an array at a surface of the base component, wherein the plurality of elements is formed of a magnetic material.

In addition to one or more of the features described above, or as an alternative, further embodiments may include an overcoat layer disposed over the plurality of elements to fully embed the plurality of elements between the base component and the overcoat layer, wherein the overcoat layer is formed of the material that forms the base component.

In addition to one or more of the features described above, or as an alternative, further embodiments may include that the plurality of elements comprises at least one of a concave element and a convex element.

In addition to one or more of the features described above, or as an alternative, further embodiments may include a reader configured to detect a characteristic of the plurality of elements to produce a unique identifier for the array of the plurality of elements.

In addition to one or more of the features described above, or as an alternative, further embodiments may include that the characteristic detected comprises a concave or convex element.

In addition to one or more of the features described above, or as an alternative, further embodiments may include that the characteristic detected comprises a polarity of the plurality of elements.

In addition to one or more of the features described above, or as an alternative, further embodiments may include that the reader comprises a magnetometer.

In addition to one or more of the features described above, or as an alternative, further embodiments may include that the plurality of elements are formed with an additive manufacturing system.

In addition to one or more of the features described above, or as an alternative, further embodiments may include that the material of the base component and the overcoat comprises a metallic material.

In addition to one or more of the features described above, or as an alternative, further embodiments may include that the material of the base component and the overcoat component comprises a polymer.

According to another embodiment, a method of identifying a component is provided. The method includes depositing a plurality of elements on a surface of a base component in an array with an additive manufacturing system, wherein the base component is formed of a material. The method also includes magnetizing the plurality of elements to have a polarity of north, south, or neutral. The method further includes covering the plurality of elements with an overcoat formed of the material that forms the base component to fully embed the plurality of elements between the base component and the overcoat. The method yet further includes detecting at least one characteristic of the plurality of elements with a reader to produce a unique identifier for the array of the plurality of elements.

In addition to one or more of the features described above, or as an alternative, further embodiments may include that the at least one characteristic detected with the reader comprises the polarity of each of the plurality of elements.

In addition to one or more of the features described above, or as an alternative, further embodiments may include that depositing the plurality of elements comprises forming an outer surface having a concave surface or a convex surface.

In addition to one or more of the features described above, or as an alternative, further embodiments may include that the at least one characteristic comprises the geometry of the outer surface of the plurality of elements.

In addition to one or more of the features described above, or as an alternative, further embodiments may include that the reader comprises a magnetometer.

In addition to one or more of the features described above, or as an alternative, further embodiments may include that covering the plurality of elements with the overcoat comprises depositing the overcoat with an additive manufacturing process.

BRIEF DESCRIPTION OF THE DRAWINGS

The subject matter which is regarded as the invention is particularly pointed out and distinctly claimed in the claims at the conclusion of the specification. The foregoing and other features and advantages of the invention are apparent from the following detailed description taken in conjunction with the accompanying drawings in which:

DETAILED DESCRIPTION OF THE INVENTION

Figure 1:
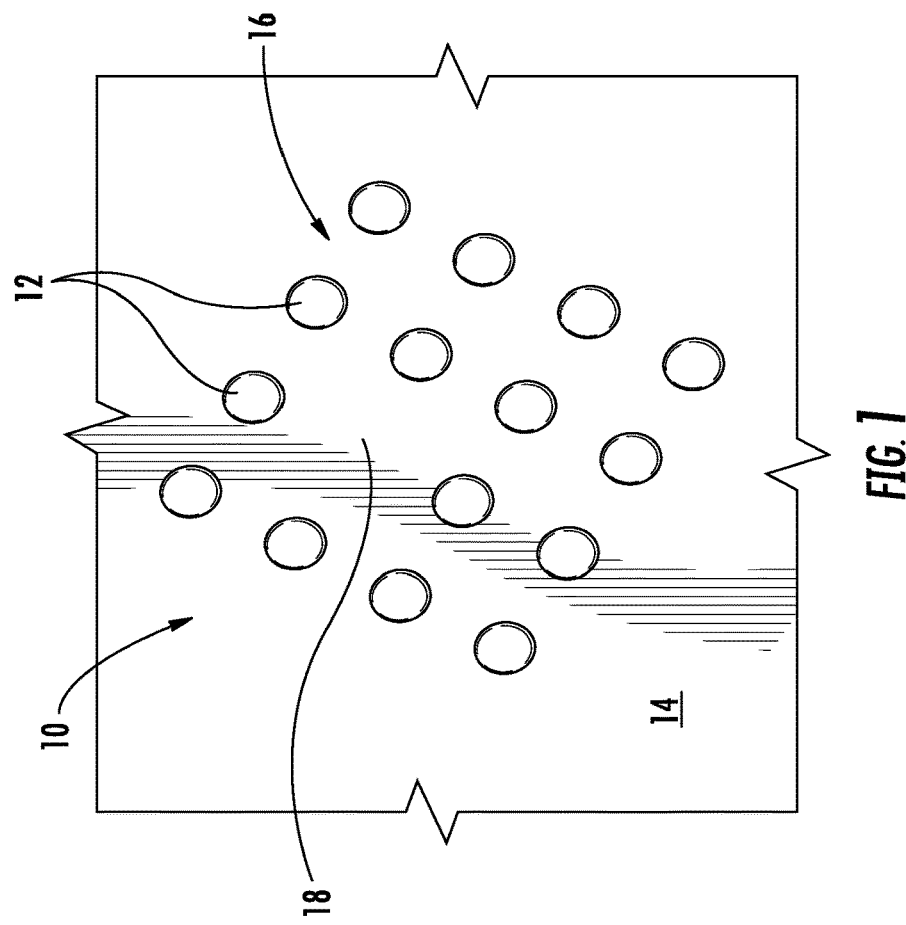
FIG. 1 is a perspective view of a plurality of elements disposed on a base component in an array.

Referring to FIG. 1, a portion of a base component 10 is illustrated. The base component 10 refers to any part, structure or component for which identification is desirable. Reliable identification of the base component 10 may be useful for a number of reasons, such as tracking or for anti-counterfeiting purposes, for example. The base component 10 may be formed of any material. Exemplary materials of the base component 10 include metal (e.g., aluminum) or a polymer, however, it is to be understood that any material may benefit from the embodiments of an embedded magnetic identification assembly described herein.

At least one, but typically a plurality of elements 12 is formed on or within a surface 14 of the base component 10. While it is contemplated that the plurality of elements 12 are integrally formed with the base component 10, exemplary embodiments include formation of the elements 12 with an additive manufacturing process. Additive manufacturing processes include depositing a material onto the surface 14 of the base component 10 to apply the elements 12 to the surface 14. A variety of known additive manufacturing processes may be employed and the particular type of additive manufacturing process will vary depending upon the particular material of the base component 10 and the material of the elements 12 to be applied to the surface 14 of the base component 10. One example of an additive process well-suited for application of the elements 12 includes laser additive techniques which employ powder injection, such as laser engineered net shape (LENS) that is similar to laser cladding. In some embodiments, cold spray techniques may be employed to deposit the elements 12 on the surface 14 of the base component 10. Due to a high bond strength achieved with cold spray deposition, excellent adhesion of the elements 12 is observed with the surface 14 (i.e., substrate) of the base component 10. A direct-write process combined with polymer additive techniques is particularly beneficial for polymeric components.

The elements 12 are formed of a magnetic material (e.g., nickel) and are applied to the surface 14 of the base component 10 in an array 16. In some embodiments, such as the illustrated embodiment, the array 16 is formed in a matrix arrangement with a specified number of rows and columns, such as the illustrated 4×4 array. In such embodiments, the number of rows and columns can vary from the illustrated embodiment. Irrespective of the precise pattern of the array 16, the elements 12 are formed in a unique array that provides a unique identifier for the base component 10.

Figure 2:
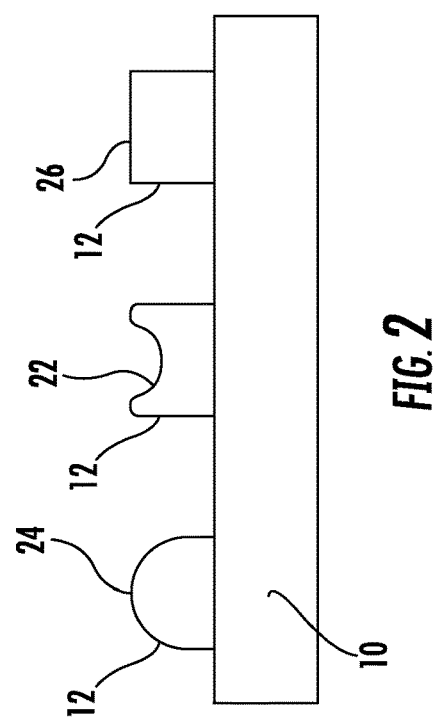
FIG. 2 is a side elevation view of representative elements illustrating a concave element and a convex element.

In addition to simply omitting one or more elements, as shown in location 18 of the array 16, the elements 12 may include one or more characteristics that provide additional facets of identification. One characteristic is that each of the elements 12 may be formed to have a particular geometry that may be two or more alternatives. For example, the elements 12 may be formed to have an outer surface 20 that is concave 22, convex 24 or planar 26 (FIG. 2). Two or all three of the specified outer surface geometries may be employed. Furthermore, it is contemplated that the elements 12 may be deposited into recesses of the base component 10.

An additional characteristic that each of the elements 12 may possess is a polarity of the magnetized material. For example, each of the elements 12 may be magnetized to have north, south, or neutral polarity.

Any of the characteristics of the elements 12 described above (i.e., array configuration, geometry, and polarity) may be used independently of each other or in any combination with each other. The more characteristics employed, the greater the number of possible unique identifiers. It is to be appreciated that these characteristics may be combined with other characteristics that produce more possible unique identifiers.

Figure 3:
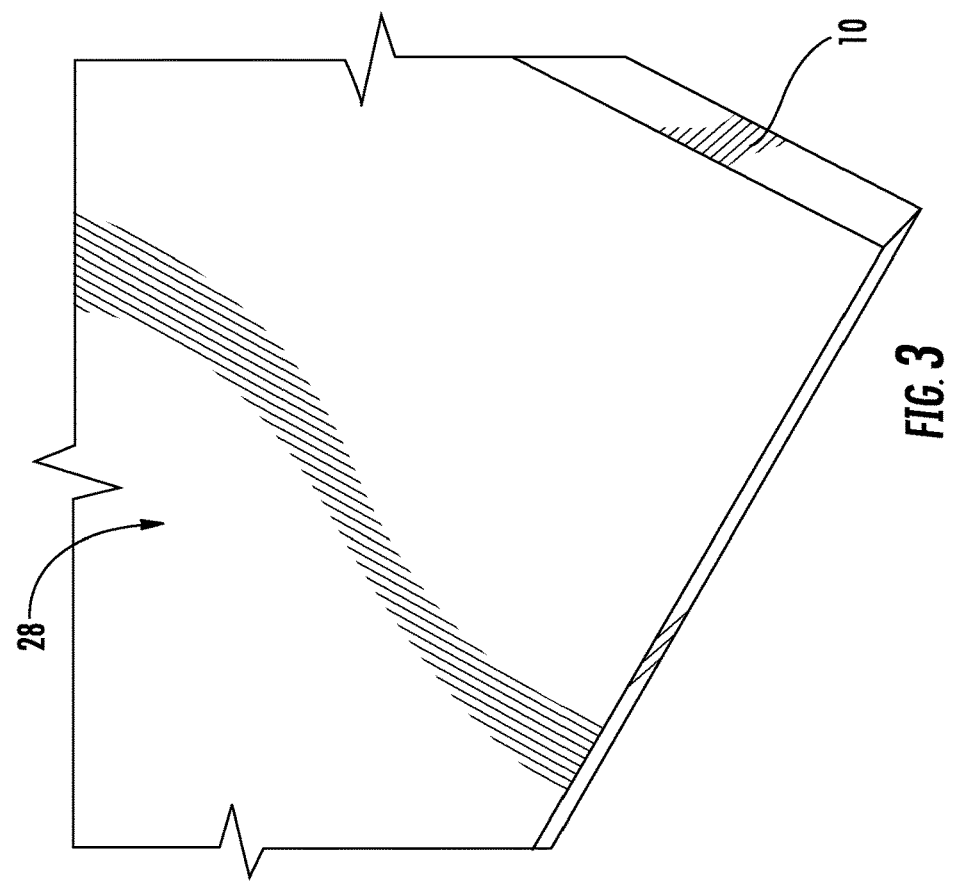
FIG. 3 is a perspective view of an overcoat disposed on the base component and the plurality of elements to embed the elements therebetween.

Referring to FIG. 3, to prevent visual observation of the elements 12, which may lead to destruction or counterfeiting of the elements 12, the plurality of elements 12 is covered with an overcoat 28 in the illustrated embodiment. Although the additive process employed to form the elements 12 often provide sufficient material characteristics to survive the harsh operating environments, the overcoat 28 provides several benefits, as described in detail below. In some embodiments, the overcoat 28 is formed of the same material as the base component 10. The overcoat 28 is at least one layer that is formed with an additive manufacturing process, as is the case with the plurality of elements 12 formed on the surface 14 of the base component 10. Any suitable additive manufacturing process may be employed to form the overcoat 28, including those described above in conjunction with formation of the plurality of elements 12. The overcoat 28 completely embeds the plurality of elements 12 between the overcoat 28 and the base component 10.

Figure 4:
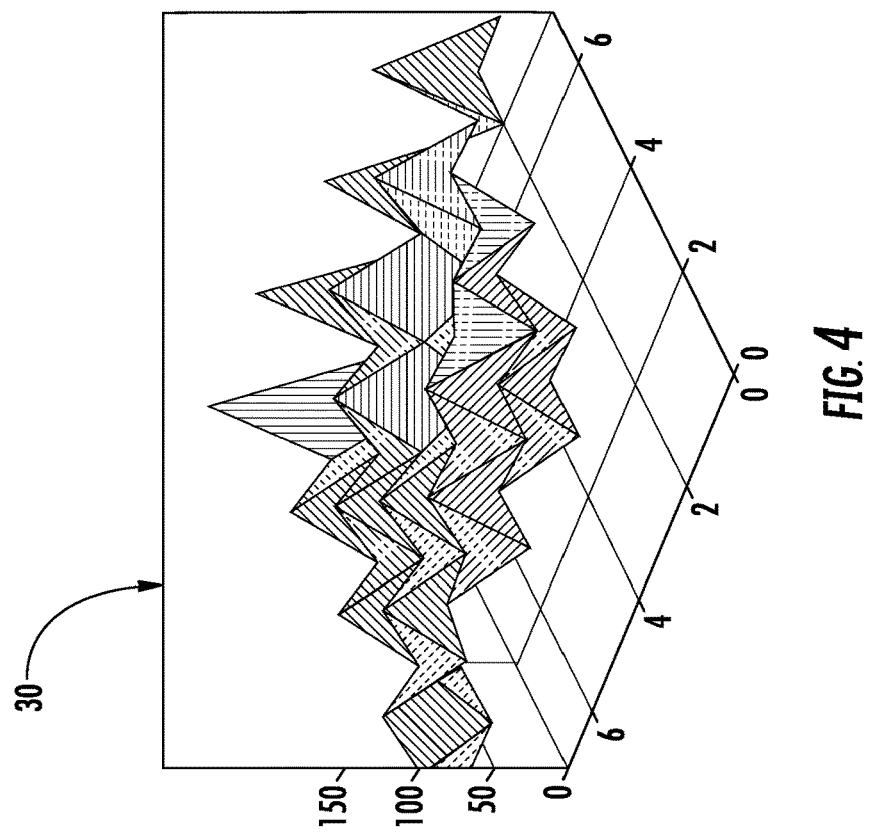
FIG. 4 is a plot illustrating detected magnetic field vector magnitudes over an area of the base component for identification of regions with the plurality of elements.

Referring to FIG. 4, a reader is configured to be placed in close proximity to the plurality of elements 12 embedded between the base component 10 and the overcoat 28 in order to detect at least one characteristic of the elements 12 to produce and/or detect a unique identifier of the elements and thereby positively identify the base component 10. In some embodiments, the reader is a magnetometer configured to detect the location and characteristic of the plurality of elements 12. In particular, the characteristics described in detail above (i.e., position, geometry and polarity) are detected by the magnetometer due to the magnetic material that the elements 12 are formed of. A magnetic field vector magnitude plot 30 is illustrated to show a magnetic field magnitude along a portion of the surface 14 of the base component 10. As shown, various peaks and valleys are illustrated to graphically depict where elements 12 are located, as well as their concavity and/or polarity. These characteristics clearly identify where elements are located by differentiating between magnetized and non-magnetized elements. The readout provides information that may be used to associate a unique signature or identifier with a particular component.

Advantageously, the embodiments described herein provide that each of the plurality of elements 12 forming the array 16 is fully embedded to render them hidden to the eye, thereby preventing the likelihood of tampering or counterfeiting of the identification features, in contrast to visually accessible identification markings that are often disposed on or attached to the surface 14 of the base component. Additionally, the elements 12 have no impact on the integrity and function of the base component 10 since they are simply added to the surface in a non-intrusive manner comprising the additive techniques described in detail above. Furthermore, due to the metallic compound that the magnetic elements are formed of, a higher resistance to temperature is achieved, thereby allowing the elements 12 to survive harsh manufacturing and operating conditions.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A magnetic identification assembly comprising:
   a base component formed of a material; and
   a plurality of elements formed in an array and extending from a surface of the base component, wherein the plurality of elements is formed of a magnetic material, wherein a body of each of the plurality of elements is identical and a geometry of a distal end of at least one of the plurality of elements within the array is different from a remainder of the plurality of elements the geometry at the distal end of the plurality of elements including at least two configurations selected from concave, convex, and planar.

2. The magnetic identification assembly of claim 1, further comprising an overcoat layer disposed over the plurality of elements to fully embed the plurality of elements between the base component and the overcoat layer, wherein the overcoat layer is formed of the material that forms the base component.

3. The magnetic identification assembly of claim 1, further comprising a reader configured to detect a characteristic of the plurality of elements to produce a unique identifier for the array of the plurality of elements.

4. The magnetic identification assembly of claim 3, wherein the characteristic detected comprises a polarity of the plurality of elements.

5. The magnetic identification assembly of claim 3, wherein the reader comprises a magnetometer.

6. The magnetic identification assembly of claim 1, wherein the plurality of elements are formed with an additive manufacturing system.

7. The magnetic identification assembly of claim 1, wherein the material of the base component and the overcoat comprises a metallic material.

8. The magnetic identification assembly of claim 1, wherein the material of the base component and the overcoat component comprises a polymer.

9. A method of identifying a component comprising:
   depositing a plurality of elements onto a surface of a base component in an array with an additive manufacturing system such that the plurality of elements extend from the surface, wherein a body of each of the plurality of elements within the array is identical and a geometry of a distal end of at least one of the plurality of elements is different from a remainder of the plurality of elements and the distal end the plurality of elements within the array includes at least two configurations selected from concave, convex, and planar, wherein the base component is formed of a material;
   magnetizing the plurality of elements to have a polarity of north, south, or neutral;
   covering the plurality of elements with an overcoat formed of the material that forms the base component to fully embed the plurality of elements between the base component and the overcoat; and
   detecting at least one characteristic of the plurality of elements with a reader to produce a unique identifier for the array of the plurality of elements.

10. The method of claim 9, wherein the at least one characteristic detected with the reader comprises the polarity of each of the plurality of elements.

11. The method of claim 9, wherein depositing the plurality of elements comprises forming the distal end of at least one of the plurality of elements with a convex configuration.

12. The method of claim 9, wherein the at least one characteristic comprises the geometry of the outer surface of the plurality of elements.

13. The method of claim 9, wherein the reader comprises a magnetometer.

14. The method of any of claim 9, wherein covering the plurality of elements with the overcoat comprises depositing the overcoat with an additive manufacturing process.

* * * * *